(12) United States Patent
Ridgers et al.

(10) Patent No.: US 7,949,313 B2
(45) Date of Patent: May 24, 2011

(54) DIRECT CONVERSION DEVICE WITH COMPENSATION MEANS FOR A TRANSMISSION PATH OF A WIRELESS COMMUNICATION EQUIPMENT

(75) Inventors: Timothy John Ridgers, Bayeux (FR); Renaud Comte, Villeneuve Loubet (FR)

(73) Assignee: ST-Ericsson SA, Geneva (CH)

( * ) Notice: Subject to any disclaimer, the term of this patent is extended or adjusted under 35 U.S.C. 154(b) by 617 days.

(21) Appl. No.: 11/722,083

(22) PCT Filed: Dec. 8, 2005

(86) PCT No.: PCT/IB2005/054128
§ 371 (c)(1),
(2), (4) Date: Jul. 14, 2008

(87) PCT Pub. No.: WO2006/064425
PCT Pub. Date: Jun. 22, 2006

(65) Prior Publication Data
US 2009/0270054 A1 Oct. 29, 2009

(30) Foreign Application Priority Data
Dec. 16, 2004 (EP) .................................... 04300908

(51) Int. Cl.
*H01Q 11/12* (2006.01)
*H04B 1/04* (2006.01)
*H04B 1/26* (2006.01)
*H04B 1/28* (2006.01)
(52) U.S. Cl. .......... 455/91; 455/118; 455/323; 455/333; 327/355
(58) Field of Classification Search .......... 455/110–111, 455/118, 323, 333; 327/355–359
See application file for complete search history.

(56) References Cited

U.S. PATENT DOCUMENTS
6,342,804 B1 * 1/2002 Havens et al. ................ 327/357
(Continued)

FOREIGN PATENT DOCUMENTS
JP 08-023231 1/1996
(Continued)

OTHER PUBLICATIONS
Japanese Office Action with English translation for application No. 2007-546249, mailed Aug. 13, 2010, 4 pages.

*Primary Examiner* — Simon D Nguyen
(74) *Attorney, Agent, or Firm* — William J. Kubida; Peter J. Meza; Hogan Lovells US LLP

(57) ABSTRACT

A conversion device (CD) is dedicated to conversion of baseband analog I/Q input signals into RF signals in a transmitting path of a wireless communication equipment. This device (CD) comprises i) first (PP1) and second (PP2) processing paths each comprising i1) an input node (IN1, IN2) receiving an input signal (I/Q), i2) an input path (IP1, IP2) connected to the input node and delivering an input current representative of the input signal (I/Q), i3) an amplification means (A1, A2) having first and second inputs fed with the input current and a common-mode current and outputting an amplified signal, and i4) a transconductor (T1, T2) delivering first and second currents from the amplified signal, the first current feeding a negative feedback path connected to the first input of the amplification means and being essentially equal to the input current, and the second current being a chosen scaled copy of the first current and representative of a voltage difference between the input signals (I/Q), H) a common-mode input path (CIP) connected to the input nodes (IN1, IN2) and delivering the common-mode current from the input signals (I/Q) to feed the second input of each amplification means (A1, A2), and iii) a switch core (SC) for mixing the second current delivered by a chosen one of the transconductors (T1, T2) with a local oscillator RF carrier to deliver output RF signals representative of the input signals (I/Q).

19 Claims, 4 Drawing Sheets

U.S. PATENT DOCUMENTS

Figure 1:
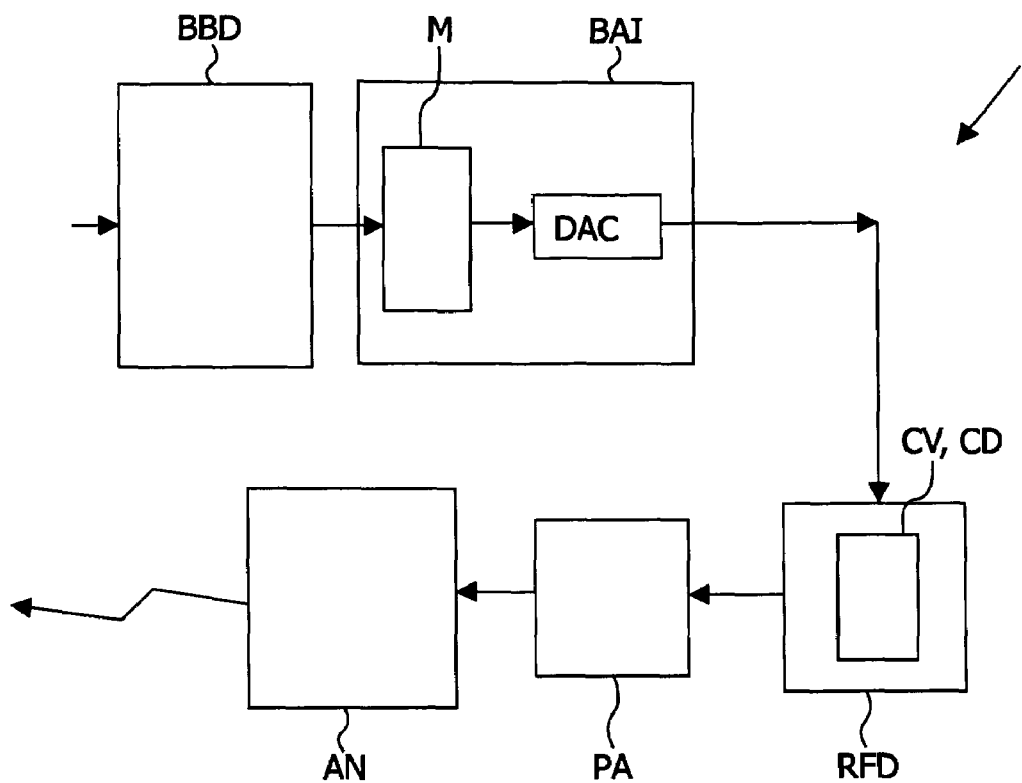

| | | | |
|---|---|---|---|
| 7,027,783 B2 * | 4/2006 | Vilhonen et al. | 455/118 |
| 7,194,242 B2 * | 3/2007 | Tanaka et al. | 455/127.3 |
| 7,280,815 B2 * | 10/2007 | Pellat et al. | 455/326 |
| 7,715,836 B2 * | 5/2010 | Vassiliou et al. | 455/423 |
| 2002/0131389 A1 * | 9/2002 | Boesch et al. | 370/342 |
| 2004/0157568 A1 * | 8/2004 | Asam | 455/127.1 |

FOREIGN PATENT DOCUMENTS

JP          2001-358537          12/2001

* cited by examiner

DIRECT CONVERSION DEVICE WITH COMPENSATION MEANS FOR A TRANSMISSION PATH OF A WIRELESS COMMUNICATION EQUIPMENT

The present invention relates to the transmission path of wireless communication equipments, and more precisely to the radio frequency (RF) conversion of baseband analog I/Q signals in a transmission path having a direct conversion architecture.

One means here by "I signal" an in-phase component signal and by "Q signal" a quadrature component signal.

In some conversion devices with a direct conversion architecture, the input baseband signals, which are differential analog I/Q voltages, are converted into RF signals by multiplication with sine and cosine RF carriers delivered by a local oscillator (LO) in a switch core comprising a pair of quadrature mixers.

This kind of direct conversion permits the generation of RF signals containing both phase and amplitude information, lending itself to a wide range of radio standards, such as GSM, EDGE, WCDMA and OFDM. It leads to a simplified circuitry, and yields adequate performance as long as a certain number of conditions (or requirements) are fulfilled, and notably:

- a sufficient pre-conditioning of the I/Q signals to achieve acceptable Signal/Noise performance,
- a good matching between I and Q channels to reduce the so-called "image spectrum",
- a good phase match between LO sine and cosine paths to reduce the image spectrum,
- a low direct current (DC) mismatch or offset to reduce the carrier leakage,
- a good RF isolation to avoid an unwanted output spectral degradation,
- a low harmonic distorsion in the baseband circuit to avoid a spectral growth,
- a gain control before or after the mixers to deliver signals covering a range of output powers.

As it is known by the man skilled in the art some of these conditions (or requirements) are in conflict. For instance the size of matched transistors may be chosen to be larger i) to reduce random lithographic errors and then to reduce mismatch, and ii) to increase device areas and reduce the 1/f noise contributions, but in the same time it must be chosen to be smaller to reduce the parasitic capacitance, and so increase the open-loop gain x bandwidth product.

Therefore when implementing the circuits required for such a direct conversion architecture, in many cases where a highest performance is needed, the dimensioning of electronic components, or the choice of the transistor structures, results from a compromise between conflicting requirements to find a suitable optimum.

So, the object of this invention is to improve the situation, and more precisely to reduce as much as possible the number of compromises to introduce to resolve the above mentioned conflicting conditions (or requirements).

For this purpose, it provides a conversion device, for converting baseband analog I/Q input signals into radio frequency (RF) signals in a transmitting path of a wireless communication equipment, comprising:

first and second processing paths each comprising
an input node adapted to receive a first or a second part of the input signals,
an input path connected to the input node and arranged to deliver an input current representative of the first or second part of the input signals,
an amplification means, comprising a first input fed with the input current and a second input fed with a common-mode current, and arranged to output an amplified signal, and
a transconductor arranged to deliver first and second currents from the amplified signal, this first current feeding a negative feedback path connected to the first input of the amplification means and being essentially equal to the input current, and this second current being a chosen scaled copy of the first current and representative of the voltage difference between the first and second parts of the input signals,
a common-mode input path connected to the input nodes of the first and second processing paths and arranged to deliver the common-mode current from the first and second parts of the input signals to feed the second input of each amplification means, and
a switch core arranged to mix the second current delivered by a chosen one of the transconductors with a local oscillator carrier at a chosen radio frequency to deliver first or second output RF signals representative of the input signals.

The conversion device according to the invention may include additional characteristics considered separately or combined, and notably:

each input path may comprise a resistive structure of a chosen resistance, said resistive structures being identical;
each resistive structure may be a switched resistive structure;
the common-mode path may comprise a first resistive structure having a chosen resistance and having a first terminal connected to the input node of the first processing path and a second terminal, and a second resistive structure having a chosen resistance and having a first terminal connected to the input node of the second processing path and a second terminal, said resistive structures being identical and said second terminals being connected therebetween and defining therebetween a common-mode node connected to the second inputs of the amplification means;
each resistive structure may be a switched resistive structure;
the common-mode path may comprise a capacitive structure connected to the common-mode node;
in a variant, each input path may comprise i) first and second resistive structures mounted in series and having first and second chosen resistances, said first resistive structures being identical and said second resistive structures being identical, and ii) a capacitive structure having a first terminal connected between the first and second resistive structures and a second terminal, said second terminals being connected therebetween;
at least each first resistive structure may be a switched resistive structure;
an auxiliary amplification means may comprise first and second inputs, respectively connected to the input paths before the first input of the amplification means, and first and second outputs respectively connected in parallel with the outputs of the amplification means;
this auxiliary amplification means may comprise i) a first bias path arranged to deliver a first bias DC current, and ii) first and second transistors respectively connected to its first and second inputs and to the first bias path and respectively defining its first and second outputs;

this first bias path may comprise a resistive structure of a chosen resistance;

each amplification means may comprise i) an input differential stage arranged to deliver a driving current from the input current, the common-mode current and a second bias DC current, ii) a current mirror stage arranged to deliver the amplified signal from the driving current, and iii) a second bias path for feeding the input differential stage with the second bias DC current;

each second bias path may comprise a resistive structure of a chosen resistance, said resistive structures being identical;

each resistive structure may be a switched resistive structure;

each transconductor may comprise i) a third bias path for delivering a third bias DC current, and ii) first and second voltage-controlled current sources mounted in parallel, the first voltage-controlled current source being arranged to deliver the first current from the output amplified signal and the third bias DC current, and the second voltage-controlled current source being arranged to deliver the second current from the output amplified signal.

each transconductor may also comprise a capacitive structure mounted in parallel with the first voltage-controlled current source;

the switch core may comprise two mixers arranged together to define a double balanced mixer structure.

The invention also provides a converter, for converting baseband analog I/Q input signals into RF signals in a transmitting path of a wireless communication equipment, and comprising two conversion devices such as the one above introduced, fed with different input signals having an orthogonal phase relationship and having respective transconductors fed with different local oscillator RF carriers having an orthogonal phase relationship.

The invention also provides a wireless communication equipment comprising a control device or a converter such as the ones above introduced.

Such equipments may be mobile phones, for instance.

Figure 2:
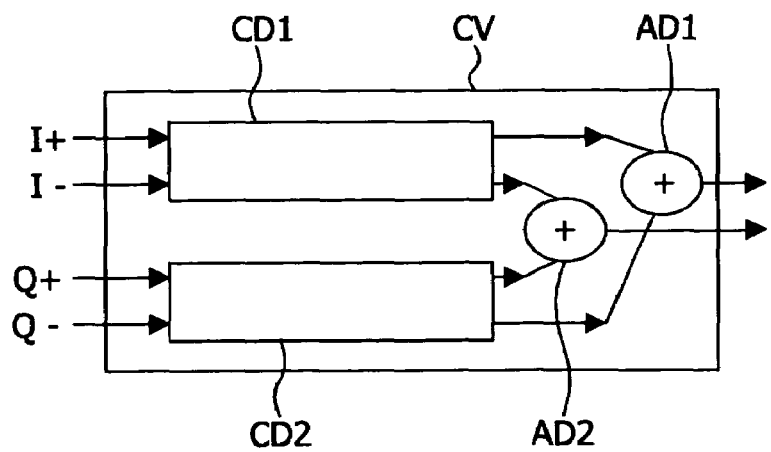
Figure 3:
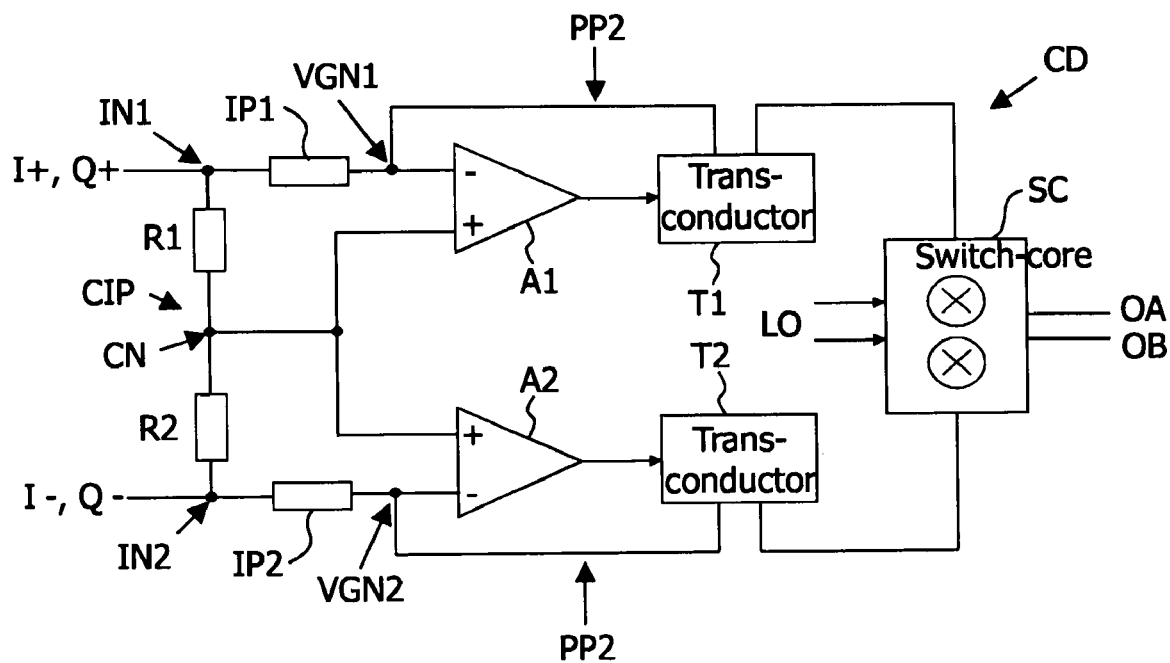
Figure 4:
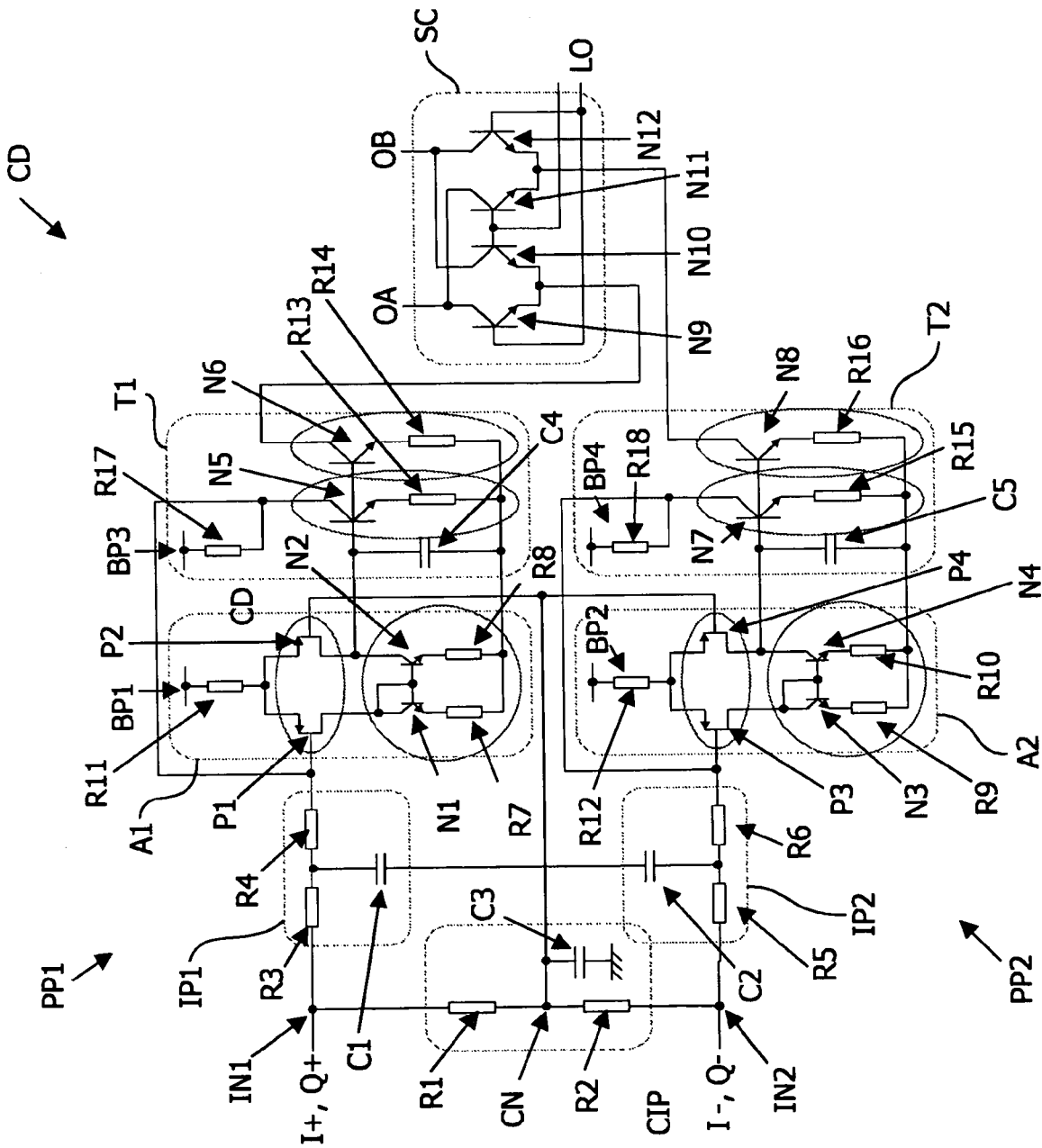
Figure 5:
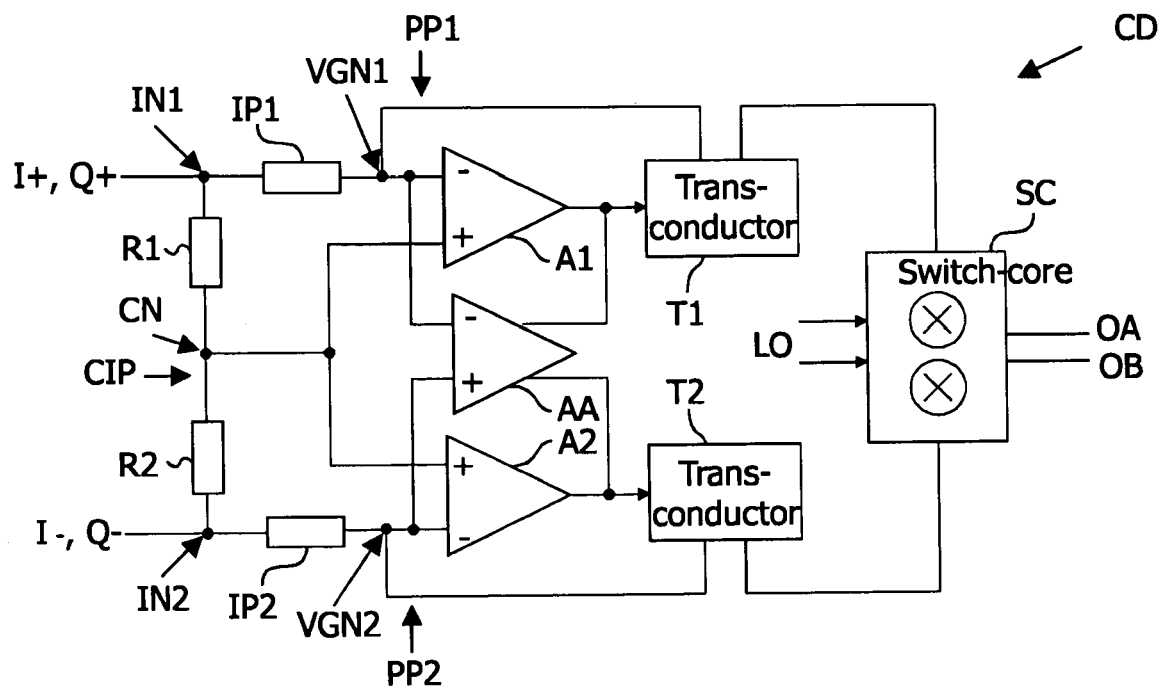
Figure 6:
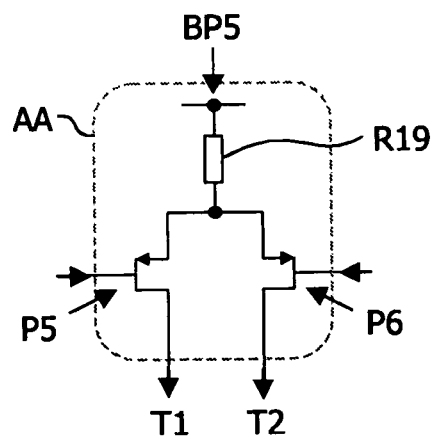

Other features and advantages of the invention will become apparent on examining the detailed specifications hereafter and the appended drawings, wherein:

FIG. 1 schematically illustrates an example of transmission path in a direct conversion architecture, FIG. 2 schematically illustrates an example of converter according to the invention, dedicated to single-sideband frequency conversion, FIG. 3 schematically illustrates a first example of embodiment of a conversion device according to the invention, FIG. 4 illustrates in more detail at transistor level the conversion device illustrated in FIG. 3, FIG. 5 schematically illustrates a second example of embodiment of a conversion device according to the invention, and FIG. 6 illustrates in more detail an example of embodiment of the auxiliary amplifier of the conversion device illustrated in FIG. 5.

The appended drawings may not only serve to complete the invention, but also to contribute to its definition, if need be.

As it is schematically illustrated in FIG. 1, in a direct conversion architecture the transmission path TP of a wireless communication equipment mainly comprises a digital baseband processor (or device) BBD, a baseband and audio interface device BAI, a radiofrequency (RF) device RFD and a power amplifier PA.

In the following description it will be considered that the wireless communication equipment is a mobile phone, for instance a GSM one or a GPRS/EDGE one or else a UMTS one, adapted to transmit (and receive) phase and/or amplitude modulated signals. But the invention is not limited to this kind of equipment. It may be also a laptop or a PDA (Personal Digital Assistant) comprising a communication device, for instance.

For the transmit direction the digital baseband device BBD of a mobile phone (for instance) mainly commises a speech coder, a channel coder, an interleaver and a ciphering. The baseband and audio interface device BAI mainly comprises a modulator M, a digital to analog converter DAC interfacing to the radiofrequency device RFD. The modulator M may be, for instance, a 8PSK or GMSK I/Q modulator. The transmit section of the radiofrequency device RFD mainly comprises filters, gain stages and a converter CV (or conversion device CD) according to the invention, connected to a power amplifier PA. Finally the power amplifier PA is connected to a radiofrequency antenna AN.

The digital baseband processor BBD, the BAI and the radiofrequency (RF) device RFD may be defined on the same chip, or on separate chips, and any combination of two of these three devices may be also defined on the same chip. So, they may be connected one to the other in a "chip-to-chip connection mode" or in a "block-to-block connection mode" (when they are integrated on the same chip).

The invention aims at providing a converter CV (or conversion device CD) arranged to convert baseband analog I/Q signals, delivered by the modulator M, into radio frequency (RF) signals.

This converter CV may comprise only one conversion device CD such as the one that will be described hereafter with reference to FIGS. 3 to 6.

But as illustrated in FIG. 2 the converter CV may also comprise two conversion devices CD1 and CD2 in order to permit a single-sideband frequency conversion. In this case, the first CD1 and second CD2 conversion devices are fed with different input signals (I+, I−) and (Q+, Q−) having an orthogonal phase relationship and with different local oscillator RF carriers having an orthogonal phase relationship. The first CD1 and second CD2 conversion devices each comprise first and second outputs to deliver the RF currents (signals) to transmit. The RF currents (signals) delivered by the first output of the first conversion device CD1 and by the second output of the second conversion device CD2 are combined in a first adder AD1, which is a current summing node. The RF currents (signals) delivered by the second output of the first conversion device CD1 and by the first output of the second conversion device CD2 are combined in a second adder AD2, which is a current summing node.

Such a converter CV may be used in a transceiver, for instance.

Reference is now made to FIG. 3 to describe in detail a conversion device CD according to the invention.

The conversion device CD comprises first PP1 and second PP2 processing paths, a common-mode input path CIP connected to the first PP1 and second PP2 processing paths, and a switch core SC also connected to the first PP1 and second PP2 processing paths.

The first PP1 and second PP2 processing paths are identical although they respectively receive the baseband analog in-phase component differential signal "I+" or the baseband analog quadrature component signals "Q+", and the baseband analog in-phase component differential signal "I−" or the baseband analog quadrature component signals "Q".

These baseband analog I/Q signals are voltages which are respectively applied to input nodes IN1 and IN2 of the first PP1 and second PP2 processing paths.

Each processing path PPi (here i=1 or 2) comprises an input path IPi (IP1 or IP2) which is connected to the input node IN1 and arranged to deliver an input current representative of the baseband analog input signal I or Q.

In an example of embodiment each input path IPi comprises one resistive structure. The resistance values of these two resistive structures are identical.

In another example of embodiment illustrated in FIG. 4 each input path IPi may contain both resistive and capacitive structures to provide filtering. The capacitive structures of the input paths IP1 and IP2 may be coupled together to present differential signal paths.

It is also possible to use switched resistive structures instead of some of the resistive structures to permit selection between multiple paths, for instance to set the filter bandwidth and/or select the signal gain.

Each processing path PPi also comprises an amplifier Ai (A1 or A2) which comprises a first input fed with the input current delivered by the corresponding input path IPi and a second input fed with a common-mode current delivered by the common-mode input path CrP.

Each amplifier Ai comprises one output to deliver an amplified signal.

These two amplifiers A1 and A2 are identical and have a chosen gain.

As will be detailed below, each amplifier Ai may be an operational amplifier.

Each processing path PPi also comprises a transconductor Ti (T1 or T2) arranged to deliver first and second currents from the amplified signal delivered by the corresponding amplifier Ai. Transconductors T1 and T2 are identical.

Each transconductor Ti converts the amplified signal (which is a voltage) to first and second currents. The first current feeds a negative feedback path connected to the first input of the corresponding amplifier Ai. The second current is a scaled copy of the first current, intended for the switch core SC.

The negative feedback is chosen so as to create a virtual ground node VGNi at the first input of the amplifier Ai. In this way, and considering that the amplifier Ai has sufficient gain, the first current outputted from the corresponding transconductor Ti is forced to be essentially equal to the current delivered by (or sourced through) the corresponding input path IPi. Therefore the current flowing through the input path IPi is proportional to the voltage difference applied between the input nodes IN1 and IN2.

The common-mode input path CIP is connected to the input nodes IN1 and IN2 of the first PP1 and second PP2 processing paths and to the second inputs of the amplifiers A1 and A2.

This common-mode input path CIP is arranged to deliver the common-mode voltage, intended for the amplifiers A1 and A2, from the baseband analog I/Q input signals (first and second parts of the input signals) applied to the input nodes IN1 and IN2. This common-mode voltage is representative of the common-mode signal applied at the I/Q input nodes IN1 and IN2.

In an example of embodiment the common-mode input path CIP comprises two resistive structures R1 and R2. The resistance values of these two resistive structures are identical. A first resistive structure R1 comprises one terminal connected to the input node IN1 of the first processing path PP1 and a second terminal connected to a common-mode node CN. A second resistive structure R2 comprises one terminal connected to the input node IN2 of the second processing path PP2 and a second terminal connected to the common-mode node CN which is connected to the second inputs of the amplifiers A1 and A2.

In another example of embodiment illustrated in FIG. 4 the common-mode input path CIP may contain both resistive and capacitive structures to provide filtering of common-mode high frequency signals.

It is possible to use switched resistive structures instead of the resistive structures R1 and R2. These switched resistive structures may allow to adjust the impedances seen by the amplifiers A1 and A2 and then to match the two branches connected to their inversing (−) and non-inversing (+) inputs. For instance, when the input stage is of a bipolar type the switched resistive structures may allow to balance the offsets generated by the base currents.

The switch core SC is arranged to mix the second current which is delivered by a chosen one of the transconductors Ti with a local oscillator carrier LO at a chosen radio frequency (RF) to deliver first OA or second OB output RF signals representative of the I or Q input signals applied to an input node INi.

The use of two nominally identical processing paths PP1 and PP2, each working from one input node IN1 or IN2 and sharing a common-mode bias point (CN), leads to a current difference output from the two transconductors T1 and T2 proportional to the differential input voltage applied to the input nodes IN1 and IN2.

As mentioned above, by combining two conversion devices CD1 and CD2, such as the one above described, fed with baseband analog I/Q input signals (I+, I−) and (Q+, Q−) having an orthogonal phase relationship and with local oscillator RF carriers with an orthogonal phase relationship, a single sideband conversion or image-reject mixing is obtained.

Since the second currents from the transconductors T1 and T2 are scaled copies of the first currents, and since each first current is forced to be a replica of the current from the input path IPi, it ensures that each second current feeding the switch core SC is a faithful image of the differential voltage applied to the input paths IP1 and IP2.

A detailed example of embodiment at a transistor level of the conversion device CD, described above with reference to FIG. 3, is illustrated in FIG. 4.

In this example the input paths IP1 and IP2 comprise respectively two resistors mounted in series (R3 and R4) and (P5 and R6) and one capacitor C1 or C2.

The resistors R3 and R5 are identical. The resistors R4 and R6 are also identical.

The capacitor C1 comprises a first terminal connected between the two resistors R3 and R4 and a second terminal. The capacitor C2 comprises a first terminal connected between the two resistors R5 and R6 and a second terminal C2 connected to the second terminal of capacitor C1. The capacitors C1 and C2 implement a first order low-pass differential filter to reduce high frequency noise contributors.

The capacitors C1 and C2 are identical. In a simplified arrangement the two capacitors C1 and C2 can be merged into a single component having a value equal to half C1 or half C2.

Moreover in this example the common-mode input path CIP comprises two resistors R1 and R2, as mentioned above, and a capacitor C3. This capacitor C3 permits filtering of common-mode high frequency signals.

Moreover in this example each differential amplifier Ai (A1 or A2) is an operational amplifier containing several stages: an input differential stage and a current mirror stage.

Each input differential stage comprises, for instance, two PMOS transistors (P1 and P2) or (P3 and P4) arranged to convert the input voltage and the common-mode voltage (which define together an input error signal) into a current that drives the corresponding current mirror stage.

Each current mirror stage comprises, for instance, two matched npn transistors (N1 and N2) or (N3 and N4). Each npn transistor N1 to N4 is degenerated at its emitter by nominally identical resistors, respectively R7, R8, R9 and RIO.

Each differential amplifier Ai (A1 or A2) also comprises a bias path BPi (BP1 or PB2) arranged to feed the corresponding input differential stage with a bias DC current. For instance each bias path BPi comprises a resistor R11 or R12 connected between a common source node of the PMOS transistors (P1 and P2) or (P3 and P4) and a bias DC current supply node (not shown).

Moreover in this example each transconductor Ti (T1 or T2) comprises two voltage-controlled current sources mounted in parallel. For instance these voltage-controlled current sources are built from an npn transistor together with a resistor connected between the emitter and the ground. The input voltage is applied at the npn base, and the output current is taken from its collector. Each first current source (N5 and R13) or (N7 and R15) is tied in parallel with the corresponding second current source (N6 and R14) or (N8 and R16).

In addition each transconductor Ti (T1 or T2) comprises a bias path (BP3 or BP4) arranged to feed the corresponding first voltage-controlled current source (N5 and R13) or (N7 and R15) with a bias DC current. For instance each bias path BP3 or BP4 comprises a resistor R17 or R18 connected between the corresponding npn transistor N5 or N7 and a bias DC current supply node (not shown).

Each transconductor Ti may also comprise a capacitor C4 or C5 mounted in parallel with the first voltage-controlled current source (N5 and R13) or (N7 and R15). Each capacitor C4 or C5 is used to fix the open-loop dominant pole of the corresponding amplifier Ai to guarantee its stability within the feedback loop. Additionally it plays a role in determining the circuit linearity and in filtering the circuit noise contributions.

The output of each of the second voltage-controlled current sources (N6 and R14) and (N8 and R16), which are the collectors of transistors N6 and N8, are connected to the switch core SC.

This switch core SC comprises, for instance, two pairs of npn transistors (N9 and N10) and (N11 and N12). For instance these four npn transistors N9, N10, N11 and N12 are connected together in the well known double balanced mixer structure, sometimes called "Gilbert cell". The common collector outputs of transistors N9 and N11 of the first and second pairs provide the current OA to an external load, while the common collector outputs of transistors N10 and N12 of the first and second pairs provide the current OB to another external load. The bases of the transistors N9 and N12 are driven by a first local-oscillator signal at the wanted RF frequency, and the bases of the transistors N10 and N11 are driven by a second local-oscillator signal at the same RF frequency. The first and second local-oscillator RF signals are differential signals.

In order to allow the selection of different current copies intended for feeding the switch core SC, each transconductor Ti (T1 or T2) may comprise several (at least two) identical second current sources (N6 and R14) or (N8 and R16).

In this case the collectors of the second current sources are connected to an output node (itself connected to the switch core SC), while the bases of these second current sources are individually connected to the corresponding amplifier output through a dedicated switch. Such a switch may be a NMOS transistor, for instance.

With such an arrangement the current gain factor depends on the number of second current sources that are simultaneously connected to the corresponding amplifier output. For instance if only one second current source amongst N is connected to the corresponding amplifier output, the current copy feeding the switch core SC is equal to I. Now if 3 second current sources amongst N are connected to the corresponding amplifier output, the current copy feeding the switch core SC is equal to 3*I. More generally if n ($1 \leq n \leq N$) second current sources amongst N are connected to the corresponding amplifier output, the current copy feeding the switch core SC is equal to n*I.

Several performance parameters of the conversion device CD are linked to the dimensioning of specific components. For instance the size of the input differential PMOS transistors of each amplifier Ai contribute in several ways:

the intrinsic I/f noise is decreased as the differential PMOS transistor area increases, the secondary pole, which enters into stability requirement, moves to higher frequency with smaller differential PMOS transistors, the ratio of channel width to length determines the transistor transconductance (Gm). A higher Gm increases the open-loop gain and the closed-loop linearity but pushes dominant pole to a higher frequency, the larger transistors have better matching which reduces the DC offset.

It therefore follows that the optimum transistor size depends on a compromise between these different performance requirements. When such a conversion device CD is designed to work in a linear transmit chain, that is without a limiter circuit, allowing faithful reproduction of amplitude modulation down the chain, it is normally required to work across a wide range of signal levels. For instance in the case of the EDGE standard the signal range is approximately equal to 50 dB, corresponding to the required variation in antenna radiated power. At the same time across this signal range, certain circuit imperfections need to be maintained below a given level, such as:

an I/Q gain mismatch contributing to image rejection, a DC offset relative to the signal level resulting in carrier leakage, thermal noise sources diminishing as the wanted signal output level falls.

To still reduce, and possibly suppress, the number of compromises to introduce, one can modify the above described example of conversion device CD.

A first solution consists in replacing some of the resistive structures (or resistors) with appropriate scaled switched resistive structures (or resistors). Preferably one may simultaneously replace the resistive structures R3, R4, R5 and R6 of the input paths IP1 and IP2 and the resistive structures R17 and RI8 of the bias paths BP3 and BP4 of the transconductors T1 and T2. Additionally, resistors can be switched in parallel with the series capacitors C1 and C2 between the common node of resistors R3, R4 and the common node of resistors R5, R6 in order to increase the range of gain steps without necessarily modifying significantly the range of values of the resistors R3 to R6.

Since for a given input differential voltage (I/Q) the first resistors R3 and R5 set current to the amplifier virtual ground nodes VGN1 and VGN2, and whereas the second resistors R17 and R18 set the DC bias current to the transconductor first current source (N5 and R13) or (N7 and R15), it is therefore possible to simultaneously set the overall conversion device gain, and adapt the DC bias so as to determine a wanted level of modulation depth.

It is recall that the modulation depth is the ratio of the peak variation in signal current level versus the DC current across a device node. As the modulation depth approaches 100% the device power efficiency increases to its maximum level. Furthermore, by scaling DC power to signal level it is possible to scale the effect of certain imperfections, such as the contribution of transistor noise sources, and the effect of some DC offsets. Too high a modulation depth however causes other problems, such as increased intrinsic non-linearities. So a judicious choice of the ratio of the resistors in the two processing paths PP1 and PP2 allows a suitable compromise to be found between these constraints for different output signal powers.

A second solution is illustrated in FIG. 5. The conversion device CD illustrated in FIG. 5 is identical to the one above described with reference to FIGS. 3 and 4, but with an auxiliary amplifier AA acting as a DC compensating amplifier.

This auxiliary amplifier AA comprises two inputs connected symmetrically between the two processing paths PP1 and PP2 and more precisely between their respective virtual ground node VGN1 and VGN2, just before the first input of the amplifiers A1 and A2. It also comprises two outputs respectively connected in parallel to the processing paths PP1 and PP2 between their amplifiers A1 and A2 and their transconductors T1 and T2.

A detailed example of embodiment at the transistor level of the auxiliary amplifier AA is illustrated in FIG. 4.

In this example the auxiliary amplifier AA comprises a differential pair of PMOS transistors P5 and P6, and a bias path BP5 feeding the differential pair of PMOS transistors P5 and P6 with a bias DC current. For instance the bias path BP5 comprises a resistor R19.

Compared to the components making-up each amplifier Ai, the input PMOS transistors of the auxiliary amplifier AA (or DC compensating amplifier) are preferably chosen to be substantially bigger in area. The DC bias resistor R19 is also preferably chosen to be of higher value so as to deliver a smaller bias DC current.

To understand the impact of the auxiliary amplifier AA one must firstly analyze the signals that are present at each amplifier virtual ground node VGNi.

Two main terms are present, both coming from the negative feedback around each amplifier Ai.

Firstly the DC voltage difference between the first and second inputs of each amplifier Ai is a measure of the DC mismatch contributions of the different stages. Systematic offsets for both amplifiers A1 and A2 are caused by structural imbalances, such as the base currents required to drive the transconductor current sources, compared to that needed by the amplifier current mirror stage. Since these systematic effects appear in both paths, they introduce no potential difference between the virtual ground nodes VGN1 and VGN2, that is the two inputs of the auxiliary amplifier AA (or DC compensating amplifier). However random mismatch between the nominally identical components adds with appropriate weighting within the feedbak loop, so as to produce an independent DC offset term for each amplifier Ai. The auxiliary amplifier AA (or DC compensating amplifier) therefore produces a differential output current proportional to this voltage. It is injected at the output with a polarity so as to mostly cancel the offset.

Moreover the second signal is an image of the modulation current. The image is due to the finite open-loop amplifier gain therefore leading to a small input error signal, necessary to drive the amplifier Ai in the needed direction. Assuming that the amplifier load impedance is mostly determined by the load presented by the transconductor Ti, then the feedback low-frequency AC current is determined by the following formula:

$$I_{AC} = \Delta V_{IN} \times G_{PMOS} \times \frac{\beta_{npn}}{(N+1)} = \frac{V_S}{R_{IN}}$$

where $\Delta V_{IN}$ is the amplifier differential input voltage, $G_{PMOS}$ is the PMOS input transistor differential pair transconductance, N is the current ratio between the output and the feedback transconductors T1 and T2, and $V_S$ is the input signal (I or Q) applied to the input path IPi with impedance $R_{IN}$.

The ratio of the amplifier differential input potential to the AC signal voltage is therefore equal to:

$$\frac{\Delta V_{IN}}{V_S} = \frac{(N+1)}{\beta_{npn} \times G_{PMOS} \times R_{IN}}$$

Typical circuit design leads to a voltage ratio below 1%, that is an open-loop gain greater than 40 dB. In comparison, the amplifier inputs see the equivalent input offset voltage fully (100%).

At higher frequencies, the dominant pole capacitor reduces the load impedance at the amplifier output, in parallel with that presented by the transconductor input. This causes the loop gain to fall and hence results in a larger input error signal to drive the amplifier feedback.

Now the main purpose of the amplifier loop is to linearize the transconductor Ti so as to support a high modulation depth, leading to lower noise for a given baseband linearity level. It therefore follows that the amplifier inputs see a pre-distorted signal to mirror that needed at the transconductor bases. The main non-linear term comes from the exponential base-emitter voltage law. However in terms of current this is more complex due to the various parallel load impedances. The pre-distortion contains harmonic terms of the modulating signal. The closer the modulating signal approaches the frequency of the amplifier dominant pole, the more the pre-distortion voltage sees a pre-emphasis for higher-order harmonics, due to the effect of feedback around a loop having diminishing gain.

Hence the signal applied to the auxiliary amplifier AA can be seen to contain three terms
  the equivalent input DC offset of the amplifier Ai due to random component mismatches,
  an AC signal representing a small fraction of the wanted modulation, and
  harmonic distortion terms due to non-linearities in the forward path.

The auxiliary amplifier AA is dimensioned by the choice of the size of its input transistors P5 and P6, and the DC bias current delivered by the bias path BP5. The transistors P5 and P6 are chosen to be substantially larger than those in the amplifiers A1 and A2, to have an intrinsically lower statistical mismatch, so a reduced DC offset, and a lower 1/f noise corner frequency. Since they are intended to only compensate for DC, and preferably not to act on the signal term, the DC bias current and transconductance are chosen to give a reduced gain and so a lower cut-off frequency than that of the amplifier Ai.

The degree of DC compensation introduced depends on the relative transistor transconductances. Furthermore a correction can only be introduced up to the level of the DC bias current of the auxiliary amplifier AA. Offsets that introduce a current larger than that sourced from the auxiliary amplifier AA cannot be corrected.

The conversion device CD and the converter CV according to the invention may be an integrated circuit realized in any technology used in chip industry fabrication.

The invention is not limited to the embodiments of conversion device, converter and wireless communication equipment described above, only as examples, but it encompasses all alternative embodiments which may be considered by one skilled in the art within the scope of the claims hereafter.

The invention claimed is:

1. A conversion device for converting baseband analog I/Q input signals into radio frequency signals in a transmitting path of a wireless communication equipment, comprising:

first and second processing paths each comprising an input node adapted to receive a first or second part of said input signals, an input path connected to said input node and arranged to deliver an input current representative of said first or second part of the input signals, an amplifier comprising a first input fed with said input current and a second input fed with a common-mode current and arranged to output an amplified signal, and a transconductor arranged to deliver first and second currents from said amplified signal, said first current feeding a negative feedback path connected to the first input of said amplifier and being essentially equal to said input current, and said second current being a chosen scaled copy of said first current and representative of a voltage difference between said first and second parts of said input signals;

a common-mode input path connected to the input nodes of said first and second processing paths and arranged to deliver said common-mode current from said first and second parts of said input signals to feed said second input of each amplifier; and a switch core arranged to mix the second current delivered by a chosen one of said transconductors with a local oscillator carrier at a chosen radio frequency to deliver first or second output RF signals representative of said input signals.

2. The conversion device according to claim 1, wherein each input path comprises a resistive structure of a chosen resistance, said resistive structures being identical.

3. The conversion device according to claim 2, wherein each resistive structure comprises a switched resistive structure.

4. The conversion device according to claim 1, wherein said common-mode path comprises a first resistive structure having a chosen resistance and having a first terminal connected to the input node of said first processing path and a second terminal, and a second resistive structure having a chosen resistance and having a first terminal connected to the input node of said second processing path and a second terminal, said first and second resistive structures being identical and said second terminals being connected therebetween and defining therebetween a common-mode node connected to said second inputs of said amplifier.

5. The conversion device according to claim 4, wherein said common-mode path comprises a capacitive structure connected to said common-mode node.

6. The conversion device according to claim 1, wherein each input path comprises first and second resistive structures mounted in series and having first and second chosen resistances, said first resistive structures being identical and said second resistive structures being identical, and a capacitive structure having a first terminal connected between said first and second resistive structures and a second terminal, said second terminals being connected therebetween.

7. The conversion device according to claim 6, wherein each first resistive structure comprises a switched resistive structure.

8. The conversion device according to claim 1, further comprising an auxiliary amplifier comprising first and second inputs, respectively connected to the input paths before the first input of said amplifier, and first and second outputs respectively connected in parallel with the outputs of said amplifier.

9. The conversion device according to claim 8, wherein said auxiliary amplifier comprises a first bias path arranged to deliver a first bias DC current, and first and second transistors respectively connected to said first and second inputs and to said first bias path and respectively defining said first and second outputs.

10. The conversion device according to claim 9, wherein said first bias path comprises a resistive structure of a chosen resistance.

11. The conversion device according to claim 1, wherein each amplifier comprises an input differential stage arranged to deliver a driving current from said input current, said common-mode current and a second bias DC current, a current mirror stage arranged to deliver said amplified signal from said driving current, and a second bias path for feeding said input differential stage with said second bias DC current.

12. The conversion device according to claim 11, wherein each second bias path comprises a resistive structure of a chosen resistance, said resistive structures being identical.

13. The conversion device according to claim 12, wherein each resistive structure comprises a switched resistive structure.

14. The conversion device according to claim 1, wherein each transconductor comprises a third bias path for delivering a third bias DC current, and first and second voltage-controlled current sources mounted in parallel, said first voltage-controlled current source being arranged to deliver said first current from said output amplified signal an said third bias DC current, and said second voltage-controlled current source being arranged to deliver said second current from said output amplified signal.

15. The conversion device according to claim 14, wherein each transconductor also comprises a capacitive structure mounted in parallel with said first voltage-controlled current source.

16. The conversion device according to claim 1, wherein said switch core comprises two mixers arranged together to define a double balanced mixer structure.

17. A converter for converting baseband analog I/Q input signals into radio frequency signals in a transmitting path of a wireless communication equipment, comprising two conversion devices according to claim 1, said conversion devices being fed with different input signals having an orthogonal phase relationship and having respective transconductors fed with different local oscillator RF carriers having an orthogonal phase relationship.

18. Wireless communication equipment comprising a transmission path, wherein said transmission path comprises a converter according to claim 17.

19. Wireless communication equipment comprising a transmission path, wherein said transmission path comprises a conversion device according to claim 1.

* * * * *

UNITED STATES PATENT AND TRADEMARK OFFICE
CERTIFICATE OF CORRECTION

| | |
|---|---|
| PATENT NO. | : 7,949,313 B2 |
| APPLICATION NO. | : 11/722083 |
| DATED | : May 24, 2011 |
| INVENTOR(S) | : Timothy Ridgers and Renaud Comte |

It is certified that error appears in the above-identified patent and that said Letters Patent is hereby corrected as shown below:

Column 12, line 40, "an" should be --and--

Signed and Sealed this
Sixteenth Day of August, 2011

David J. Kappos
*Director of the United States Patent and Trademark Office*